United States Patent [19]

Palmour et al.

[11] Patent Number: 4,945,394
[45] Date of Patent: Jul. 31, 1990

[54] BIPOLAR JUNCTION TRANSISTOR ON SILICON CARBIDE

[75] Inventors: John W. Palmour, Raleigh; John A. Edmond, Apex, both of N.C.

[73] Assignee: North Carolina State University, Raleigh, N.C.

[21] Appl. No.: 113,692

[22] Filed: Oct. 26, 1987

[51] Int. Cl.$^5$ .............................................. H01L 29/72
[52] U.S. Cl. ...................................... 357/34; 357/61; 357/56; 437/100
[58] Field of Search ...................... 357/34, 56, 61, 91, 357/52; 437/100

[56] References Cited

U.S. PATENT DOCUMENTS 2,918,396 12/1959 Hall ........................................ 357/61
4,762,806 8/1988 Suzuki et al. ........................ 437/100

FOREIGN PATENT DOCUMENTS 8201619 5/1982 PCT Int'l Appl. .................... 357/61

OTHER PUBLICATIONS

Silicon Carbide Field-Effect and Bipolar Transistors; W. v. Muench, P. Hoeck and E. Pettenpaul, Institut A fuer Werkstoffkunde Technische Universitaet Hanover; D-3000 Hanover, Germany, 1977.
Whatever Happened to Silicon Carbide, Robert B. Campbell, IEEE Transactions on Industrial Electronics, vol. IE-29, No. 2, May 1982.
A. L. Robinson, *Chemical Coat Helps Semiconductor Prospects*, Research News, Oct. 2, 1987, Science, vol. 238, pp. 27-29.
R. C. Weast, Ph.D. and M. J. Astel, Ph.D., *CRC Handbook of Chemistry and Physics*, 62nd Editiion, B-101.

Primary Examiner—Andrew J. James
Assistant Examiner—Mark Prenty
Attorney, Agent, or Firm—Bell, Seltzer, Park & Gibson

[57] ABSTRACT

The invention comprises a bipolar junction transistor formed in silicon carbide. By utilizing high temperature ion implantation of doping ions, the base and emitter can be formed as wells, resulting in a planar transistor. Mesa-type transistors are also disclosed.

6 Claims, 1 Drawing Sheet

BIPOLAR JUNCTION TRANSISTOR ON SILICON CARBIDE

FIELD OF THE INVENTION

The present invention relates to electronic devices formed on semiconductor substrates and is particularly directed towards a bipolar junction transistor formed on silicon carbide.

BACKGROUND OF THE INVENTION

The bipolar junction transistor (BJT) is a well known and frequently used semiconductor electronic device. A bipolar junction transistor is generally defined as a device formed of a semiconductor material having two p-n junctions in close proximity to one another. In operation, current enters a region of the semiconductor material adjacent one of the p-n junctions which is called the emitter. Current exits the device from a region of the semiconductor material adjacent the other p-n junction which is called the collector. Generally speaking, the collector and emitter will have the same conductivity type, either p or n. A small portion of semiconductor material having the opposite conductivity type (either p or n) from the collector and the emitter is positioned between the collector and the emitter which is known as the base. The transistor's two p-n junctions exist where the collector meets the base and where the base meets the emitter. Because of their respective structures and conductivity types, bipolar junction transistors are generally referred to as n-p-n or p-n-p transistors.

In operation, when current is injected into or extracted from the base, depending upon whether the transistor is n-p-n or p-n-p, , it will greatly affect the flow of charge carriers (i.e. electrons or holes) which can move from the collector to the emitter. Typically, small currents applied to the base can control proportionally large currents passing through the transistor, giving it its usefulness as a component of electronic circuits.

One of the requirements for an operable and useful junction transistor is an appropriate semiconductor material from which it can be formed. The most commonly used semiconductor material is silicon (Si), and recently attention has grown with respect to other semiconductor materials such as gallium arsenide (GaAs) and indium phosphide (InP). For given circumstances and operations, these materials all have appropriate applications.

Another material for which great semiconductor potential has long been recognized, but for which appropriate techniques for producing both the material itself and devices formed from it have been lacking, is silicon carbide (SiC). Silicon carbide has well-known advantageous semiconductor characteristics: a wide bandgap, a high thermal conductivity, a high melting point, a high electric field breakdown strength, a low dielectric constant, and a high saturated electron drift velocity. Taken together, these qualities mean that electronic devices formed from silicon carbide should have the capability of operating at higher temperatures, at high device densities, at high speeds, at high power levels and even under high radiation densities, as compared to other semiconductor materials. Accordingly, attempts to produce device quality silicon carbide and devices formed from silicon carbide have been of interest to scientists and engineers for several decades.

Silicon carbide is, however, a difficult material to work with. It crystallizes in well over 150 polytypes, some separated by very small thermodynamic differences. As a result, from a practical standpoint, growth of the sufficiently defect-free single crystals required for electronic devices has remained an elusive goal. Silicon carbide's high melting point renders techniques such as alloying or diffusion of dopants more difficult, usually because a number of the other materials necessary to perform such operations tend to break down at the high temperatures required to affect silicon carbide. Silicon carbide is also an extremely hard material, and indeed its most common use is as an abrasive.

Accordingly, the patent and scientific literature is filled with attempts to grow larger single crystals of silicon carbide and thin films of monocrystalline silicon carbide, as well as attempts to produce junctions, diodes, transistors and other devices from this material.

Several prior patents describe attempts to produce junction transistors on silicon carbide. One such attempt is described by Hall in U.S. Pat. No. 2,918,396. Hall discusses a method of forming junction transistors from silicon carbide which emphasizes forming mechanical and electrical contacts. Hall's technique calls for placing an alloy in contact with a monocrystalline wafer of silicon carbide. The alloy is formed from silicon and a potential dopant material. By heating the wafer of silicon carbide while it is in contact with the alloy, the alloy potentially melts, dissolves a small portion of the silicon carbide wafer, and allows the dopant to permeate the silicon carbide. Following cooling, a doped portion of silicon carbide results. If the silicon carbide starting material is already doped in an opposite conductivity type, a p-n junction also results. By performing the same technique on opposite sides of the monocrystalline portion of silicon carbide, two p-n junctions result, forming the basis for a junction transistor.

The device as described in this patent, however, have failed to meet with any commercial success, most likely because of the lack of control inherent in the described doping technique, as well as the relatively large samples of silicon carbide which are required, making them unsuitable for modern miniaturized electronic devices such as integrated circuits.

In a later patent, No. 3,201,666, Hall discusses a method of forming non-rectifying contacts to silicon carbide, another fundamental technique in producing a useful electronic device. According to Hall, such a non-rectifying contact can be formed by joining a body of monocrystalline silicon carbide to a base member formed of molybdenum, tungsten or a molybdenum-tungsten alloy, with an intermediate layer of another alloy in between, the intermediate alloy being a eutectic alloy of silicon carbide and the base material. As is the case with the earlier described Hall technique, the techniques taught in the '666 patent have failed to meet with commercial success, very likely because of the size requirements called for by Hall. Specifically, because one goal for silicon carbide semiconductor devices is to have them remain operable at rather high temperatures (Hall suggests 1000° C.), any contacts made with silicon carbide must be able to withstand the thermal expansion which the silicon carbide will undergo at these temperatures. Hall suggests that a relatively large contact is a key to dealing with these problems. As stated above, however, any significant size requirement for silicon carbide devices essentially renders them useless for modern electronic devices. Such considerations may not have been a great factor at the time of Hall's work in the late 1950's and early 1960's.

Wallace, U.S. Pat. No. 3,254,280, discusses a unipolar transistor formed from silicon carbide which is formed by doping an entire crystal of silicon carbide to give it a first conductivity type, and then doping the entire outer portion of the crystal silicon carbide to give it a second conductivity type. In the resulting structure, a second conductivity type exterior surrounds a core of the first conductivity type. Wallace's device has likewise failed to gain any commercial or practical acceptance, probably because of the inherent difficulty in obtaining appropriate samples of silicon carbide. As is known to those familiar with electronic devices, the production of silicon carbide suitable for such devices has remained a rather elusive goal. As a result, continued interest in silicon carbide and devices formed from it has waned among many researchers.

In the scientific literature, Von Muench et al. also describe attempts to form bipolar junction transistors in silicon carbide, *Silicon Carbide Field Effect and Bipolar Transistors*, Technical Digest of 1977 International Electronic Device Meeting, Institute of the Electronic Engineers, New York, 1977, p. 337. Von Muench fabricated a bipolar junction transistor from 6H alpha silicon carbide using a multiple Cl gas etching sequence to obtain contact to the emitter and base of an n-p-n structure. The collector contact was made to the back of the n-type 6H alpha silicon carbide substrate. As indicated on p. 337 of Von Muench's paper, however, his technique required diffusion doping in silicon carbide at temperatures in excess of 1900° centigrade or generation of p-n junctions by epitaxial growth of a doped silicon carbide layer. In particular, von Muench's paper admits that "ion implantation in silicon carbide has not yet been studied in detail."

Finally, Von Muench obtained his silicon carbide crystals by the Lely sublimation process, the earliest established sublimation technique, but one which has never resulted in producing silicon carbide of a crystal quality sufficient to produce commercial devices.

Recently, however, a number of significant developments have been accomplished in several areas of silicon carbide technology. A number of these developments are the subject of co-pending patent applications assigned to the common assignee of the present invention, and the contents of which are incorporated herein by reference.

These include: Davis et al. "Growth of Beta-SiC Thin Films and Semiconductor Devices Fabricated Thereon," Ser. No. 07/113,921, filed Oct. 26, 1987, now U.S. Pat No. 4,912,063; Davis et al.; "Homoepitaxial Growth of Alpha-SiC Thin Films and Semiconductor Devices Fabricated Thereon," Ser. No. 07/113,573, filed Oct. 26, 1987, now U.S. Pat. No. 4,912,064; Edmond et al.; "Implantation and Electrical Activation of Dopants into Monocrystalline Silicon Carbide," Ser. No. 07/113,561, filed Oct. 26, 1987, now abandoned; and Davis et al. "Sublimation of Silicon Carbide to Produce Large, Device Quality Single Crystals of Silicon Carbide," Ser. No. 07/113,565, filed Oct. 26, 1987, now U.S. Pat. No. 4,866,005. Taken together, these developments have resulted in the production of large, device quality single crystals of silicon carbide, successful epitaxial growth of both beta and alpha silicon carbide thin films on such silicon carbide crystals, a novel and successful technique for introducing and activating dopant ions into silicon carbide, and the potential for forming various devices.

Accordingly, it is an object of the invention to provide a bipolar junction transistor formed on silicon carbide which is formed from an epitaxial layer of silicon carbide having a first conductivity type upon a substrate of silicon carbide having the opposite conductivity type in which the emitter has the same conductivity type as the substrate, and is formed in the epitaxial layer by high temperature ion implantation of doping ions into the epitaxial layer. As used herein, the term "substrate" can refer to both single crystal substrates or monocrystalline epitaxial thin films.

It is another object of the invention to provide a method of forming such a bipolar junction transistor.

It is a further object of the invention to provide a planar bipolar junction transistor capable of operating at high temperatures and under conditions of high radiation density, which transistor has a heavily doped collector and heavily doped emitter of a first conductivity type, a base of opposite conductivity type formed within a portion of doped silicon carbide having the same conductivity type as the collector and the emitter, and ohmic contacts formed upon the base, the emitter and the collector.

It is another object of the invention to provide a mesa bipolar junction transistor capable of operating at temperatures over 500° centigrade and under conditions of high radiation density which transistor comprises a collector and emitter formed of the same heavily doped conductivity type silicon carbide, a base formed of doped silicon carbide of the opposite conductivity type from the collector and the emitter, and respective ohmic contacts upon the base, the emitter, and the collector.

Other objects and features of the invention and the manner in which the same are accomplished, along with exemplary examples, will be better understood according to the detailed description of the invention, taken in conjunction with the accompanying drawings in which:

SUMMARY OF THE INVENTION

The invention comprises a method of making a bipolar junction transistor capable of operating at temperatures over 500° centigrade and under conditions of high radiation density and at high speeds. The method comprises forming an epitaxial layer of silicon carbide having a first conductivity type upon a substrate of silicon carbide having the opposite conductivity type and forming an emitter having the same conductivity type as the substrate and located in the epitaxial layer of silicon carbide of first conductivity type by high temperature ion implantation of doping atoms into the epitaxial layer.

DETAILED DESCRIPTION

As discussed earlier, production of a practically and commercially successful bipolar junction transistor requires high quality substrate material, an effective doping technique, and an appropriate structure for the device itself. Successful growth of both alpha and beta silicon carbide thin films and of large single crystals of silicon carbide have now been accomplished in accordance with the invention techniques and patent applications referred to earlier, the contents of which are incorporated herein by reference.

In particular, however, the high temperature ion implantation technique referred to and used in the manufacture of bipolar junction transistors of the present invention includes directing an ion beam of dopant ions onto a silicon carbide substrate while the silicon carbide substrate is maintained at a temperature of 600K or greater. The conductive near surface layer which results from the ion bombardment is then removed, usually by oxidizing the surface and then removing the oxidized layer. Finally, an annealing step completes the activation of the dopant ions. Because of the novel implantation technique, the annealing can be accomplished at relatively moderate temperatures on the order of about 1200° C.

Figure 1:
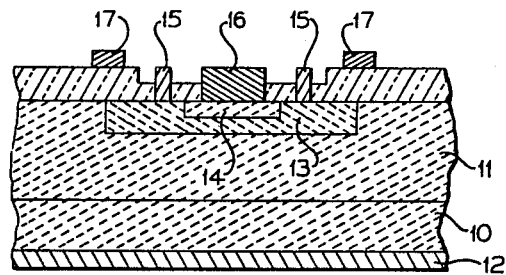
FIG. 1 is a gated planar bipolar junction transistor according to the present invention.

FIG. 1 illustrates an embodiment of a planar bipolar junction transistor according to the present invention. The transistor is formed from a substrate 10 which in the particular embodiment is heavily doped n-type silicon carbide. Preferably, the substrate 10 is doped during growth, for example by diffusion. A layer 11 of doped silicon carbide having the same conductivity type as substrate 10 is positioned upon the substrate 10 and together substrate 10 and layer 11 serve as the collector portion of the transistor. In the illustrated embodiment, these are n-type silicon carbide, and are formed epitaxially and doped during the epitaxial growth procedure. An ohmic collector contact 12 is positioned adjacent the substrate 10 opposite from the layer 11.

The use of a heavily doped portion to form a part of the collector encourages carriers (electrons or holes) to flow more quickly between the collector and the collector contact by decreasing the resistance therebetween. This increases the switching speed of the device.

The base of the transistor is indicated at 13 and in the planar BJT illustrated, comprises a well formed of p-type silicon carbide material which was created by doping layer 11 with a p-type carrier according to the high temperature ion implantation technique described and referenced earlier.

The emitter 14 similarly comprises a well formed by high temperature ion implantation, and in this embodiment is of the same heavily doped n-type character as the substrate portion 10 of the collector. Ohmic contacts 15 are made with the base 13 and ohmic contact 16 is in contact with the emitter 14. Conducting gate material 17 is positioned on passivating layer of silicon dioxide 20 and serves to help confine the depletion region of the transistor.

As is known to those familiar with such devices, the planar structure of a bipolar junction transistor is advantageous in a number of circumstances. For example, because the emitter and base comprise defined wells formed by ion implantation, the area between the respective p-n junction is confined, depletion is more properly focused, and stray or parasitic capacitances from the p-n junction is avoided.

Because the base and emitter form wells in a planar bipolar junction transistor, however, they cannot be obtained by in-situ growth either with or without follow-up etching. Instead, they must be produced by ion implantation techniques of which those described herein are not only novel to silicon carbide, but the only successful ion implantation techniques for using silicon carbide which both minimize lattice damage and maximize electrical activation of the dopants.

Figure 2:
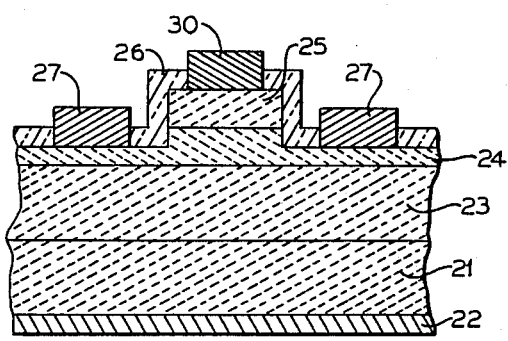
FIG. 2 is a mesa bipolar junction transistor according to the present invention.

A bipolar junction transistor can also be formed according to the present invention using techniques which form what is known as a mesa bipolar junction transistor. FIG. 2 illustrates one such mesa bipolar junction transistor. In the embodiment illustrated in FIG. 2, the layer 21 is a substrate of silicon carbide which is heavily doped to give it an n-type character. Layer 23 of n-type doped silicon carbide is adjacent layer 21 and together they make up a decreased-resistance collector as described earlier. An ohmic contact 22 provides the electrical contact to the collector. Each of the layers 21 and 23 can be formed by in-situ growth of the doped material as necessary or desired.

The base 24 is of p-type character and can be formed in the mesa bipolar junction transistor either by in-situ doping or ion implantation. The emitter 25 is of the same more heavily doped n-type character as the collector 21 and in turn can likewise be formed by in-situ doping or ion implantation. It will be understood from the structure illustrated in FIG. 2, that because the emitter, base and collector are all separate layers of silicon carbide material rather than wells as in the embodiment illustrated in FIG. 1, that the respective layers illustrated in FIG. 2 can be produced by successive epitaxial growth of doped silicon carbide layers upon one another. They can then be selectively etched to form the mesa structure illustrated in FIG. 1. The embodiment in FIG. 2 therefore provides a mesa BJT which can be formed independently of ion implantation.

The bipolar junction transistor in FIG. 2 also includes a passivating layer of silicon dioxide 26 as well as ohmic contacts 27 and 30 to the base 24 and emitter 25, respectively. Additionally, in the structure illustrated the etched borders of the emitter 25 help confine the n-p junction between the emitter and the base in a manner similar to that in which the wells confined this junction in the embodiment shown in FIG. 1. In the embodiment of FIG. 2, however, there is no corresponding border to help confine the p-n junction between the base and the collector.

Figure 3:
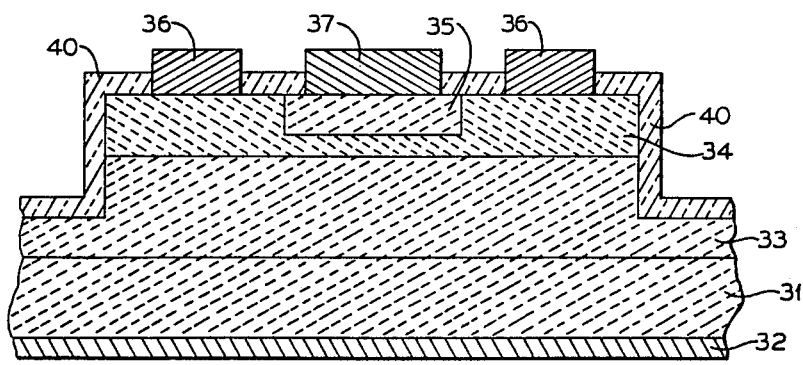
FIG. 3 is a second embodiment of a mesa bipolar junction transistor according to the present invention.

A third BJT embodiment which represents a second embodiment of a mesa type BJT is illustrated in FIG. 3. This type of bipolar junction transistor which can be formed using a combination of in-situ doping techniques and the high temperature ion implantation doping techniques described herein and in the co-pending reference. The bipolar junction transistor in FIG. 3 comprises a collector formed from heavily doped n-type layer 31 and another layer of n-type material 33. These collector layers are bordered by an ohmic contact 32 and serve to decrease the resistance and increase the switching speed of the device in the manner described earlier. Layers 31 and 33, and base 34 are all formed by epitaxial growth of silicon carbide which is doped in-situ rather than by ion implantation. Base 34 is of opposite conductivity type from the collector layers 31 and 33. Emitter 35, however, is added as a well of more heavily doped n-type material corresponding to the more heavily doped n-type material in layer 31 in the collector, and is implanted as a well into the in-situ doped base 34 using high temperature ion implanation techniques. This design and associated manufacturing technique give the base and emitter portions of the transistor of FIG. 3 certain advantageous characteristics in common with a planar bipolar junction transistor. Specifically, the etched shoulders of the base 34 help confine the base-collector junction and the implanted nature of the emitter well 35 helps confine the emitter-base junction, all of which focuses the depletion region and reduces stray or parasitic capacitances in the manner described earlier.

As in the previously illustrated embodiments, the base 34 and emitter 35 are bordered by respective ohmic contacts 36 and 37. As in the previous embodiments, a passivating layer 40 of silicon dioxide is also present.

Further to the present invention, it has been discovered that where etching of silicon carbide layers is desired or necessary, a preferred technique comprises reactive ion etching with nitrogen trifluoride ($NF_3$). Nitrogen trifluoride has demonstrated a number of advantages in silicon carbide etching processes and is a novel development in its own right. A more complete discussion of reactive ion etching using $NF_3$ is provided Palmour et al., *Surface Characteristics of Monocrystalline Beta-SiC Dry Etched in Fluorinated Gases*, Mat. Res. Soc. Symp. Proc., Vol. 76, 1987, p. 185., the techniques of which are incorporated herein by reference.

The invention which has been set forth is a bipolar junction transistor (BJT) that is fabricated in silicon carbide (all polytypes) as opposed to silicon, gallium arsenide, or other semiconductors. Because silicon carbide is a wide bandgap semiconductor that has the ability to operate at much higher temperatures than other common semiconductors, the transistor of the present invention likewise demonstrates superior operating characteristics at high temperatures. The transistors of the present invention also have the ability to operate at higher powers and higher frequencies. Both passivated planar and mesa designs have been disclosed in various configurations and can be used to obtain either n-p-n or p-n-p transistors. The disclosed designs utilize both in-situ doping during crystal growth, and high temperature ion implantation as methods of obtaining doped layers. Reactive ion etching with $NF_3$ and gated base collector junctions have been demonstrated for obtaining device isolation. The underlying more heavily doped layers or substrates at the collectors are used to decrease collector resistance for the transistor; a more heavily doped n-layer being useful in this fashion for an n-p-n transistor and a more heavily doped p-layer being useful for this function for a p-n-p transistor.

In the specification and drawings, there have been set forth preferred and exemplary embodiments of the invention which have been included by way of example and not by way of limitation, the scope of the invention being set forth in the accompanying claims.

That which is claimed is:

1. A mesa bipolar junction transistor formed from silicon carbide and capable of operating at temperatures over 500° C. and under conditions of high radiation density, and comprising:

a single crystal substrate formed of silicon carbide;

a collector formed of an epitaxial layer of silicon carbide on said single crystal substrate and having a first conductivity type;

a base adjacent said collector formed of an epitaxial layer of doped silicon carbide upon said collector and having the opposite conductivity type from said collector, with said base having the bottom segment of a mesa structure extending from the surface thereof;

an emitter formed of an epitaxial layer of silicon carbide upon said bottom segment of said mesa structure of said base and having the same conductivity type as said collector so that said bottom segment and said emitter together form said mesa structure with a substantially planar p-n junction between said emitter and said base in said mesa structure; and respective ohmic contacts upon said base, said emitter, and said collector.

2. A mesa bipolar junction transistor according to claim 1 and further comprising a passivating layer upon the portions of said base and said emitter which do not include said ohmic contacts.

3. A bipolar junction transistor according to claim 2 wherein said passivating layer comprises silicon dioxide.

4. A mesa bipolar junction transistor capable of operating at temperatures over 500° C. and under conditions of high radiation density, and comprising:

a collector comprising a single crystal substrate of silicon carbide having a first conductivity type and an epitaxial layer of silicon carbide on said substrate of silicon carbide having the same conductivity type as said single crystal substrate with said epitaxial layer including the bottom segment of a mesa structure extending from the surface thereof;

a base adjacent said collector and formed of an epitaxial layer of doped silicon carbide upon said bottom segment of said mesa structure of said epitaxial layer of said collector and having the opposite conductivity type from said collector so that said bottom segment and said base together form said mesa structure with the p-n junction between said collector and said base within said mesa structure;

an emitter in said base and formed of an implanted well of silicon carbide having the same conductivity type as said collector within said base; and respective ohmic contacts upon said base, said emitter, and said collector.

5. A mesa bipolar junction transistor according to claim 4 and further comprising a passivating layer upon the portions of said base and said emitter which do not include said ohmic contacts.

6. A bipolar junction transistor according to claim 5 wherein said passivating layer comprises silicon dioxide.

* * * * *

UNITED STATES PATENT AND TRADEMARK OFFICE
CERTIFICATE OF CORRECTION

PATENT NO. : 4,945,394
DATED : July 31, 1990
INVENTOR(S) : John W. Palmour and John A. Edmond Page 1 of 1

It is certified that error appears in the above-identified patent and that said Letters Patent is hereby corrected as shown below:

<u>Column 1,</u>
Line 4, insert the following statement prior to "FIELD OF THE INVENTION"
-- The U.S. Government has a paid-up license in this invention and the right in limited circumstances to require the patent owner to license others on reasonable terms as provided for by the terms of contract N00014-82-K-0182 awarded by the Office of Naval Research. --

Signed and Sealed this

Eighth Day of March, 2005

JON W. DUDAS
*Director of the United States Patent and Trademark Office*